(12) United States Patent
Saito et al.

(10) Patent No.: US 8,282,399 B2
(45) Date of Patent: Oct. 9, 2012

(54) ELECTRICAL CONNECTOR

(75) Inventors: Takeshi Saito, Tokyo (JP); Masakazu Ezaki, Tokyo (JP); Toshiyuki Takada, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 168 days.

(21) Appl. No.: 12/877,230

(22) Filed: Sep. 8, 2010

(65) Prior Publication Data

US 2011/0059624 A1    Mar. 10, 2011

(30) Foreign Application Priority Data

Sep. 10, 2009   (JP) .................................. 2009-209207

(51) Int. Cl.
*H01R 13/60* (2006.01)
(52) U.S. Cl. ............................ 439/41; 439/331; 439/135
(58) Field of Classification Search .................... 439/41, 439/331, 940, 135
See application file for complete search history.

(56) References Cited

U.S. PATENT DOCUMENTS

| | | | |
|---|---|---|---|
| 6,371,776 B1 * | 4/2002 | Li et al. .......................... | 439/135 |
| 6,439,901 B1 * | 8/2002 | Ji et al. .......................... | 439/135 |
| 7,332,317 B2 * | 2/2008 | Omori et al. .................. | 435/196 |
| 7,670,145 B2 * | 3/2010 | Cheng ............................ | 439/41 |

FOREIGN PATENT DOCUMENTS

| | | |
|---|---|---|
| JP | 06-050286 U | 7/1994 |
| JP | 2007-335231 | 12/2007 |

OTHER PUBLICATIONS

Office Action for Japanese Patent Application 2009-209207, Japan Patent Office, Aug. 16, 2011.

* cited by examiner

*Primary Examiner* — Xuong Chung Trans
(74) *Attorney, Agent, or Firm* — Kubotera & Associates, LLC

(57) ABSTRACT

An electrical connector includes a housing having an opening portion in an upper surface thereof including a width edge in a short side direction and a side edge in a long side direction; a terminal disposed in the housing; and a suction member detachably attached to the housing. The suction member includes a plate portion for covering the housing and an attachment portion for attaching to the housing at a middle portion of the side edge. The plate portion includes an attachment region between both end portions of the attachment portion in the long side direction and a non-attachment region outside the attachment region extending to a distal end portion of the plate portion in the long side direction. The non-attachment region includes a deformable portion with a free end portion to be deformable.

13 Claims, 8 Drawing Sheets

ELECTRICAL CONNECTOR

BACKGROUND OF THE INVENTION AND RELATED ART STATEMENT

The present invention relates to an electrical connector having a suction member attached thereto for suctioning and conveying the connector. The present invention further relates to a suction member, and a method of mounting an electrical connector.

When an electrical connector is conveyed to a mounting position of a circuit board or the like, a suction member may be temporarily attached onto the electrical connector, so that a suctioning device suctions the suction member to convey the electrical connector. More preferably, the suctioning device is capable of directly suctioning a part of the electrical connector without the suction member.

In general, the suctioning device approaches the electrical connector from above. Accordingly, when the electrical connector has an opening in an upper surface thereof, and the upper surface does not have an enough area for suctioning, it is necessary to attach the suction member. The suction member may be temporarily attached to the electrical connector until, for example, the electrical connector is conveyed to a specified mounting position on a circuit board. After the electrical connector is connected to the circuit board with solder, the suction member may be detached from the electrical connector.

Patent Reference has disclosed a conventional suction member. In an electrical connector disclosed in Patent Reference, terminals are arranged in a housing in a longitudinal direction thereof on a longer side relative to a width direction thereof. The terminals have connecting sections so as to connect by soldering to a circuit board when the electrical connector is disposed on the circuit board. The housing has an opening portion in an upper surface thereof for receiving a mating connector.

Patent Reference: Japanese Patent Publication No. 2007-335231

The conventional suction member as a suction cover is attached to the upper surface of the housing, and may be made of a metal plate. The conventional suction member has a relatively wide section to cover the opening portion and two types of attaching legs provided on both end portions of the relatively wide section in a longitudinal direction thereof. With the attaching legs, the conventional suction member is attached to the housing.

As disclosed in Patent Reference, when the connector includes the housing with the opening portion in the upper surface thereof, and the terminals are connected to the circuit board by soldering at the connecting sections thereof, the housing tends to deform upon soldering and receiving heat. When the housing thermally expands in the longitudinal direction thereof, an upper surface side tends to expand by a length smaller than that of a bottom surface side due to the opening portion. As a result, the bottom surface side of the housing, which has a larger expansion length, tends to warp and deform so as to lift from the circuit board at the both end portions in the longitudinal direction. Accordingly, it is difficult to securely connect the terminals to the circuit board at the lifted portions. In Patent Reference, the conventional suction member is attached to the housing for reinforcing there housing, thereby preventing the warping and deformation.

In the conventional suction member disclosed in Patent Reference, the conventional suction member is attached to the housing only at the both end portions in the longitudinal direction thereof. Accordingly, when the terminals are connected to the circuit board with solder at the connecting sections thereof, the housing receives heat upon soldering and tends to deform such that the both end portions move away from the circuit board. the middle portion moves away from the suction member since the suction member is not secured thereon at all. To prevent the problem, the attaching legs of the suction member at the both ends have to be extremely strong, but this may be hardly achievable as long as the sucking member is made from sheet metal. Unless the attaching legs are not sturdily attached to the housing, even if the thickness of the suction member is increased, it would be difficult to fully prevent the warping and deformation of the housing.

In view of the above, there is provided an invention, an object of which is to provide an electrical connector with a suction member and the suction member, in which the suction member may be made from thin sheet metal and whereby it is possible to fully prevent the warping and the deformation of the housing. An object of the invention also includes a method of implementation of the electrical connector.

Further objects and advantages of the invention will be apparent from the following description of the invention.

SUMMARY OF THE INVENTION

In order to attain the objects described above, according to the present invention, an electrical connector with a suction member includes an opening formed in an upper surface of a housing for holding a plurality of terminals, and a suction member arranged to be freely detachable/attachable from/onto the upper surface of the housing of the electrical connector. The terminals are connected to a circuit board by soldering at a lower surface side of the housing. It is possible to convey the electrical connector with a suction device.

According to the invention, in the electrical connector with the suction member, the upper surface of the housing has width edges along a short side direction and a side edges along a long side direction, and the suction member is made of a sheet metal having flexibility. The suction member has a plate portion that covers at least a part of the upper surface of the housing and an attachment portion to attach the plate portion to the housing at a middle position of the side edge of the housing in the long side direction. The plate portion forms an attachment region as an area between both end portions of the attachment portion and a non-attachment region outside the attachment region and extending to an end portion in the long side direction. The non-attachment region has a free end portion at the end portion and has a deformable portion at least partially.

Accordingly, in the electrical connector of the invention, the suction member is attached to the housing by the attachment portion provided at the middle position in the long side direction. The suction member has the deformable portion at the both end sides, which is the free end portion of the non-attachment region, and contacts with the upper surface of the housing or very close thereto.

Once the connector is conveyed to a mounting position with the suction device and soldered thereto, the housing may start to warp and deform in a lifting direction at the both end portions thereof upon soldering and receiving heat. If the housing becomes warped or deformed, the housing contacts with the deformable portion of the suction member and receives a spring force from the deformable portion as a counterforce. Accordingly, the housing is restricted from warping and deformation, so that it is possible to stop or restrict to minimize the warping and deformation of the housing.

In the invention, the plate portion may be designed to contact with the upper surface of the housing at least at the deformable portion of the non-attachment portion.

When the deformable portion contacts with the housing from the beginning, whenever the housing gradually warps or deforms even slightly, such warping and deformation may be effectively restricted by the deformable portion. The configuration would work as long as the deformable portion contacts with the housing at least partially. In this case, the plate portion may preferably contact with the upper surface of the housing at least at the deformable portion of the non-attachment region with certain contact pressure. When the deformable portion contacts with the housing with certain contact pressure from the beginning, the restrictive force towards the housing can work more strongly for the contact pressure.

In the invention, the plate portion may contact with the upper surface of the housing at the free end portions, or the plate portion may have a flat surface and contacts evenly by surface with the upper surface of the housing.

In the invention, the plate portion preferably forms a space with the upper surface of the housing in the attachment region, and has a protrusion, which projects upward, so as to have the free end portions contact with the upper surface of the housing.

With the configuration, simply by attaching the suction member to the housing at the attachment portion, it is possible to exert contact pressure onto the free end portions. In this case, the attachment portion may be provided at the edge section in the attachment region at the center position of the plate portion in the long side direction. The attachment region may be formed as an attaching leg provided at the side edge of the plate portion in the attachment region. The attaching leg may be disposed at the both end positions in the attachment region in the long side direction. In this case, the plate portion may be configured to have a reinforcing section formed at a different portion from that for the attaching leg.

With the reinforcing section, it is possible to enhance the rigidity, i.e., strength, of the attachment region. Alternatively, the plate portion may be configured to have the reinforcing section formed at the free end portion edge section in the non-attachment region. With the configuration, it is possible to secure the contact with housing at the free end portions.

In the invention, the non-attachment region may not have the deformable portion all over the non-attachment region, and may have the deformable portion on the free end portion sides and have a rigid section, which has higher rigidity than that in the deformable portion, near the attachment region.

According to the invention, when the plate portion of the suction member is formed as a flat surface and the housing has a protrusion, the suction member attached to the housing can flex and thereby it is possible to obtain the contact pressure as the counterforce. More specifically, by providing the protrusion on the upper surface of the housing and having the attachment region of the suction member contact or close to the upper surface of the housing while pressing the attachment region of the suction member, the suction member is attached thereto. With the procedure, the deformable portion of the suction member generates contact pressure upon attachment.

In the electrical connector of the invention, for example, for implementation to a circuit board by soldering, prior to the soldering, the suction member is attached to the upper surface of the housing, which flexes and deforms by a temperature increase upon soldering the connector. Then, after the suction member is suctioned with the suction device and the connector is conveyed to a soldering position, the connector is soldered. Once the connector is soldered, the suction member is detached.

As described above, according to the invention, the suction member is attached to the housing at the attachment portion, which is provided in the middle in the long side direction of the housing. The both end portions of the suction member are provided as the non-attachment portions, and a deformable portion is formed at the both end regions, which are the free end portion sides of the non-attachment regions, so as to dispose the deformable portion onto the upper surface of the housing. Therefore, even if the both end portions of the housing are lifted upon soldering of the terminals, the housing receives a spring force from the deformable portion of the suction member as a counterforce. Accordingly, the warping and deformation of the housing is blocked or restricted, so that it is possible to prevent unsatisfactory soldering of terminals. Since the suction member is flexible, it is possible to make the suction member from a relatively inexpensive sheet metal, and also inexpensively and easily.

BRIEF DESCRIPTION OF THE DRAWINGS

FIGS. 4(A) and 4(B) are side views showing the electrical connector in an assembling process thereof according to the embodiment of the invention, wherein FIG. 4(A) is a side view before the suction member is attached, and FIG. 4(B) is a side view after the suction member is attached;

FIGS. 10(A) and 10(B) are front views showing a modified example of the electrical connector according to the embodiment of the invention, wherein FIG. 10(A) is a front view showing the suction member, and FIG. 10(B) is a front view showing the electrical connector.

DETAILED DESCRIPTION OF THE PREFERRED EMBODIMENTS

Hereunder, embodiments of the present invention will be explained with reference to the accompanying drawings.

Figure 1:
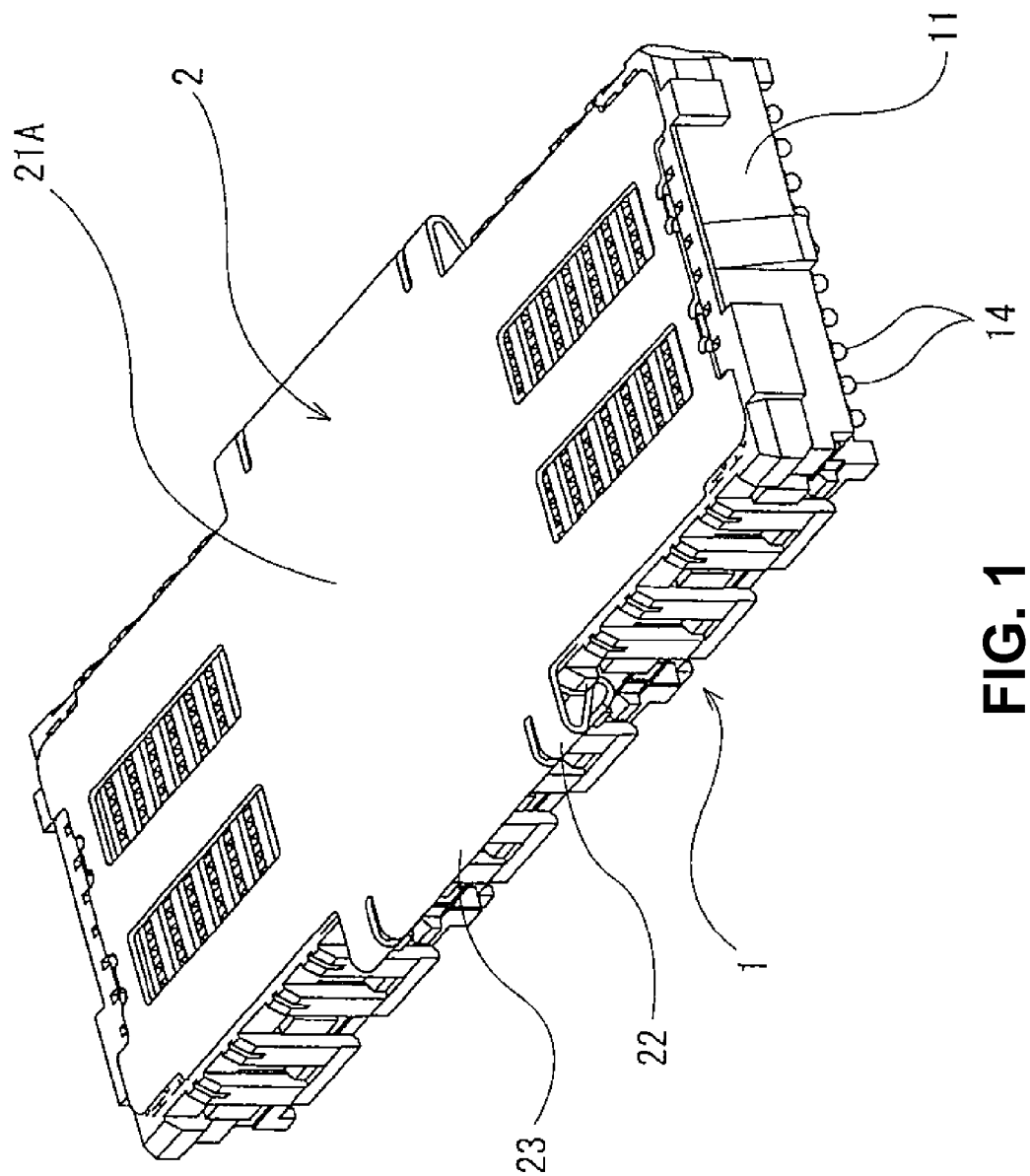
FIG. 1 is a perspective view showing an electrical connector with a suction member according to an embodiment of the invention.

FIG. 1 is a perspective view showing an electrical connector with a suction member 2 according to an embodiment of the invention. As shown in FIG. 1, the electrical connector 1 has the suction member 2 on an upper surface thereof for suctioning and conveying the connector 1 to a mounting position using a suction device prior to implementation of the connector 1 by soldering onto a circuit board.

The connector 1 includes a housing 11, which is composed of an upper housing member 12 and a lower housing member 13 and holds terminals (not illustrated). Connecting sections of the terminals that protrude from a lower face of the lower housing member 13 have solder balls 14 for implementation of the connector by soldering onto a circuit board, or the like. The upper housing member 12 has locking legs 12A on the side face in the longitudinal direction, each of which has a U-shape whose bottom protrudes downward and has elasticity. Each locking leg locks at a locking protrusion 13A provided in a corresponding position on the side face of the lower housing member 13, so as to join the housing members 12 and 13. The locking is made by an upper edge of the bottom part of the U-shape of the locking leg 12A and an upper edge of the locking protrusion 13A.

Figure 2:
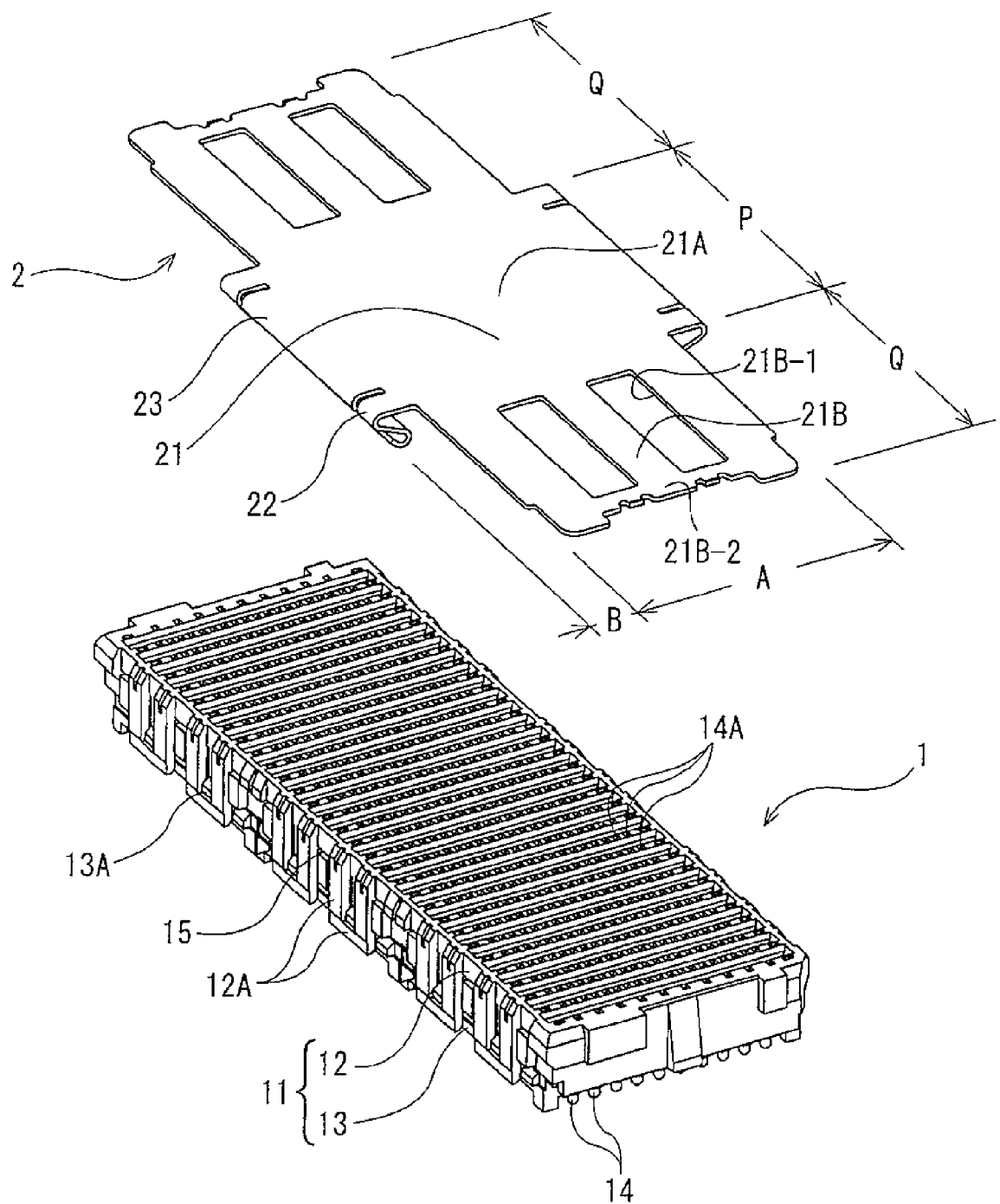
FIG. 2 is a perspective view showing the electrical connector in a state where the suction member is detached from the electrical connector according to the embodiment of the invention.

FIG. 2 is a perspective view showing the electrical connector 1 in a state where the suction member 2 is detached from the electrical connector 1 according to the embodiment of the invention. As shown in FIG. 2, on an upper surface of the housing 11, a plurality of terminal receiving holes 14A (opened holes) is provided for receiving a group of terminals of a mating connector (not illustrated). The terminal receiving holes 14A are formed in rows along the width direction of the housing 11, and are also respectively formed in columns along the longitudinal direction of the housing 11. In other words, the terminal receiving holes 14 are provided in rows and columns in the width direction and longitudinal direction for receiving the terminals that protrude from the mating connector.

Figure 3:
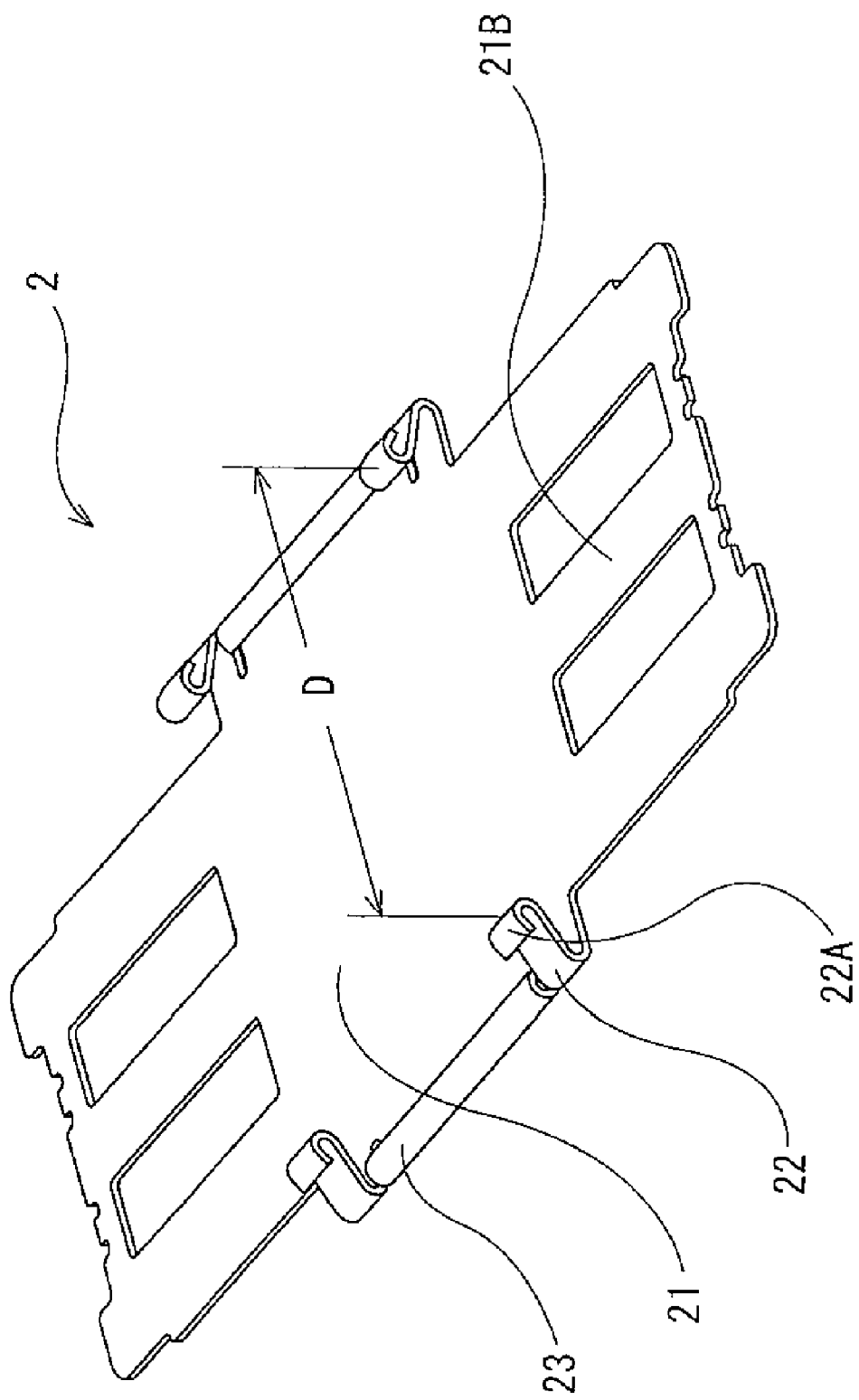
FIG. 3 is a perspective view showing the suction member viewed from a back side thereof according to the embodiment of the invention.
Figure 4A:
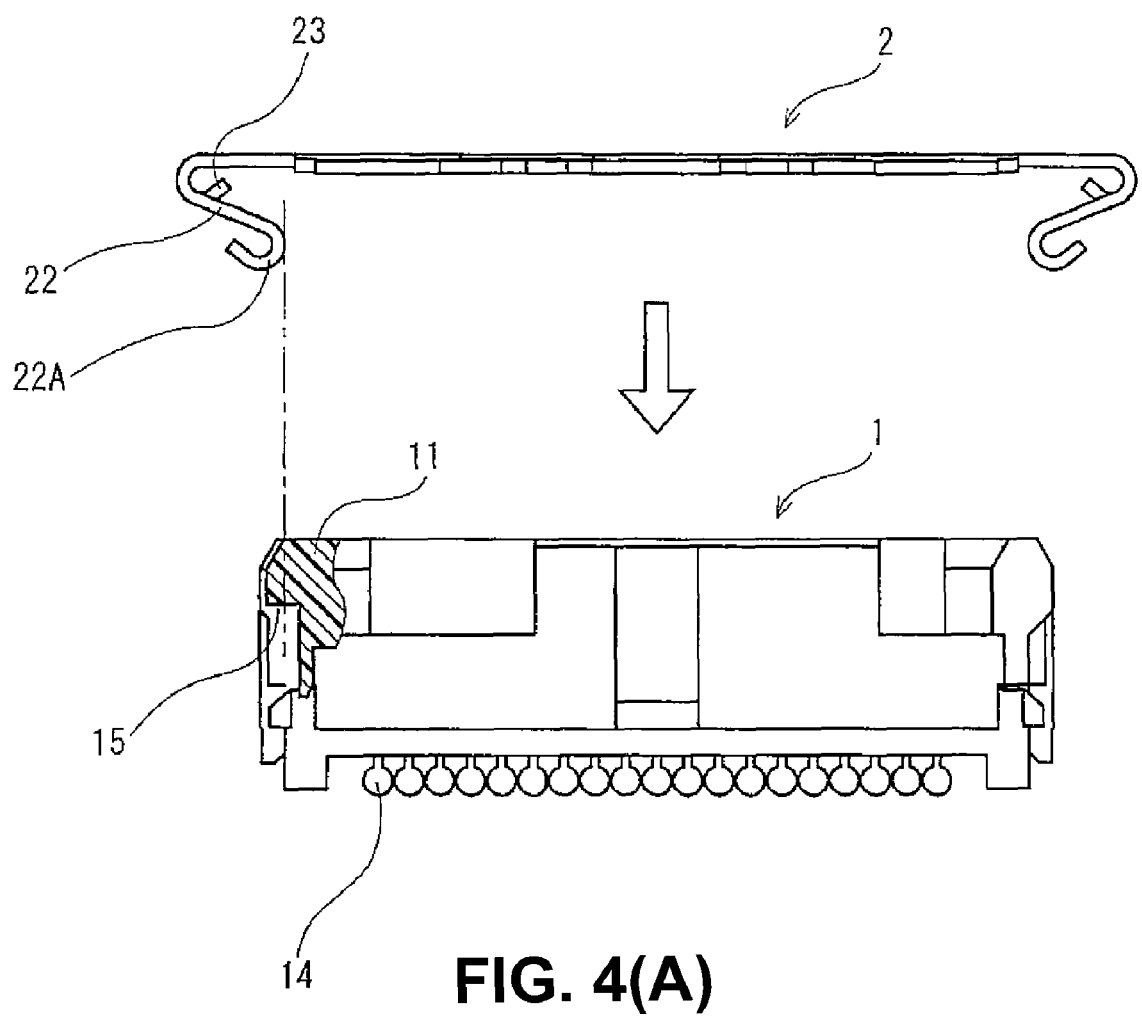
Figure 4B:
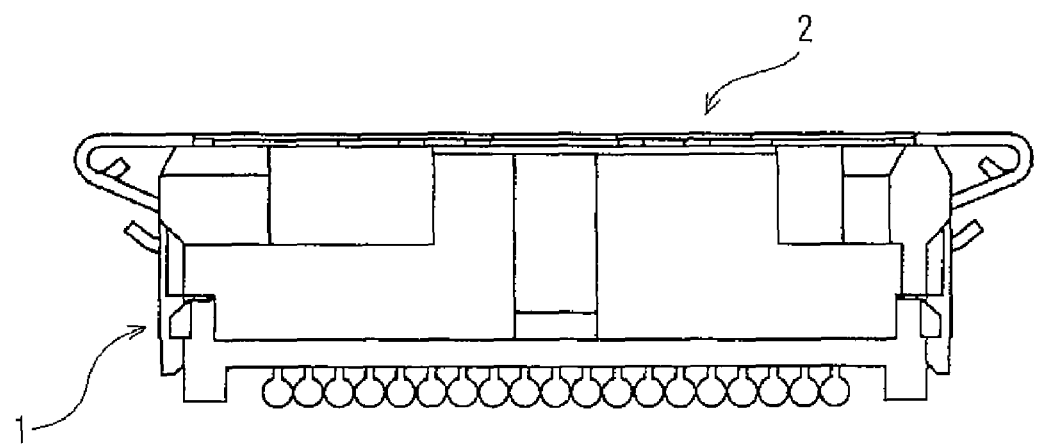

FIG. 3 is a perspective view showing the suction member 2 viewed from a back side thereof according to the embodiment of the invention. FIGS. 4(A) and 4(B) are side views showing the electrical connector 1 in an assembling process thereof according to the embodiment of the invention. More specifically, FIG. 4(A) is a side view before the suction member 2 is attached, and FIG. 4(B) is a side view after the suction member 2 is attached. The upper housing member 12 of the housing 11 has locking projections 15 as shown in FIG. 4(A) between the U-shaped locking legs 12A. The locking projections 15 work to attach the aforementioned suction member 2.

The suction member 2 is made by punching and bending sheet metal, and has dimensions in the width direction and longitudinal direction so as to substantially cover the upper surface of the housing 11 as shown in FIG. 2. The suction member 2 has a plate portion 21 having a flat surface in Range A in the width direction and has attachment portions 22 in Ranges B, which respectively project from side edges of the plate portion 21 in the longitudinal direction. In the longitudinal direction, the plate portion 21 has area, which is divided into attachment region P in the middle portion and non-attachment regions Q on the end sides.

In the plate portion 21, the attachment region P forms a portion to be suctioned 21A by the suction device on the wide flat surface. The portion to be suctioned 21A has enough area to be suctioned by the suction device on the flat surface, on which no hole or protrusion is formed. In the attachment region P, attachment portions 22 and reinforcing sections 23 are provided projecting from side edges of the portion to be suctioned 21A.

As shown in FIG. 3, a backside view of the suction member 2, the attachment portions 22 and the reinforcing sections 23 extend towards the backside (upper side in FIG. 3) and are bent in the thickness direction. The attachment portions 22 are provided on the both ends in the longitudinal direction of the attachment region P, and respectively have an attaching leg that has an S-shape. Each attaching section 22 has a locking section 22A, which is curved to a hook shape, at the free end side.

The distance D between the locking sections 22A of the two attachment portions 22, which face each other in the width direction, is set so as to lock at the locking projections 15 formed at corresponding positions in the housing 11 (refer to FIG. 4(A)). A reinforcing section 23 is provided between the two attachment portions 22, which are provided at the both ends of each side edge in the attachment region P. The reinforcing areas 23 are curved to form a C-shaped sectional face, and enhance the rigidity against flex of the plate portion 21 in the attachment region P.

The plate portion 21 has a deformable portion 21B respectively forming a flat surface, which does not have anything at the side edges, in each non-attachment regions Q on the both ends of the attachment region P in the longitudinal direction. In the embodiment, each deformable portion 21B has windows 21B-1 so as to have satisfactory flexibility. On the free end 21B-2 side of each deformable portion 21B, the end edge has a shape that is identical to that of the corresponding section of the housing.

The suction member 2 formed in this way is attached to the connector 1 prior to suctioning and conveyance to a mounting position of the connector by the suction device. As shown in FIG. 4(A), the suction member 2 is moved to be above the connector 1 and then descend as is. Then, each locking section 22A, which is a tip (lower end) of the attaching section 22 of the suction member 2, contacts with the housing 11, and each attaching section 22 elastically deforms to increase the distance between the locking sections 22A of the attachment portions 22, which face to each other, and the locking sections 22A are locked at the locking projection 15 of the housing 11. With the operation, the suction member 2 would not come off from the connector 1 and also the attachment region P including the attachment portions 22 is held by the connector 1 (See FIG. 4(B)). The plate portion 21, which forms a flat surface, generally evenly contacts with the upper surface of the housing 11 by the surface.

The connector 1 having the suction member 2 attached thereto has appearance shown in FIG. 1, and provides a wide portion to be suctioned 21A in the center of the plate portion 21. The suction device (not illustrated) suctions the portion to be suctioned 21A and lifts the connector 1, and convey to the mounting position. In the connector 1 disposed on a mounting position, e.g. on a circuit board, solder balls 14 provided on the terminals contact by surface with corresponding positions of the circuit, where the solder balls 14 are heated by hot air or the like to melt and then connected to the corresponding circuit part by soldering.

By heating the solder balls for soldering, temperature of the housing 11 also increases. In the suction member 2 firmly attached to the connector 1 in the attachment region P, the free end of the deformable portion 21B in each non-attachment region Q contacts by surface to or becomes close to the upper surface of the housing 11. Accordingly, if the temperature of the housing 11 increases and the both ends in the longitudinal direction start to warp and deform so as to lift from the circuit board, the housing 11 contacts with the free end in each non-attachment region Q of the suction member 2, receives the counterforce from the free ends, and the flexing and deformation of the housing 11 is restricted.

In other words, the housing 11 will not warp and deformed, or otherwise undergoes only minimum warping and deformation. As a result, it is possible to satisfactorily maintain the soldered connection between terminals and a circuit board. Once the solder-connected portion is fully cooled, the suction member 2 may be detached from the connector 1. Accordingly, the connector is ready for connection with the mating member.

It should be understood that the invention shall not be limited by those embodiments illustrated in FIGS. 1-4 and may be altered, modified, or varied in various manners.

Figure 5:
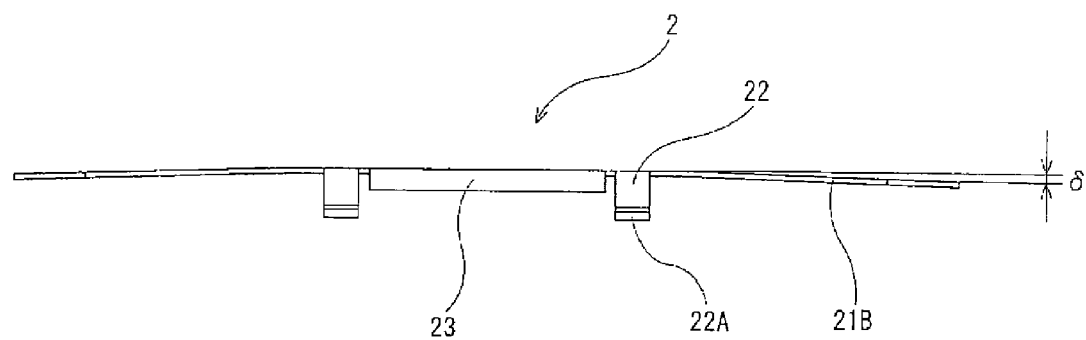
FIG. 5 is a front view showing a modified example No. 1 of the suction member according to the embodiment of the invention.

FIG. 5 is a front view showing a modified example No. 1 of the suction member according to the embodiment of the invention. As shown in FIG. 5, the non-attachment region Q is formed by bending downward in relative to the attachment region P for a slight deformation δ towards the free end.

If the suction member 2 configured in this way is attached to the connector at the attaching section, the attachment region P forms space with the upper surface of the housing, so as to reduce the deformation δ, and the free end of the non-attachment region Q contacts with the housing of the connector with certain contact pressure. If the plate portion 21 is also attached to contact with the housing in the attachment region P so as to make the deformation δ to "0", the contact pressure at the free end can further increase.

Figure 6:
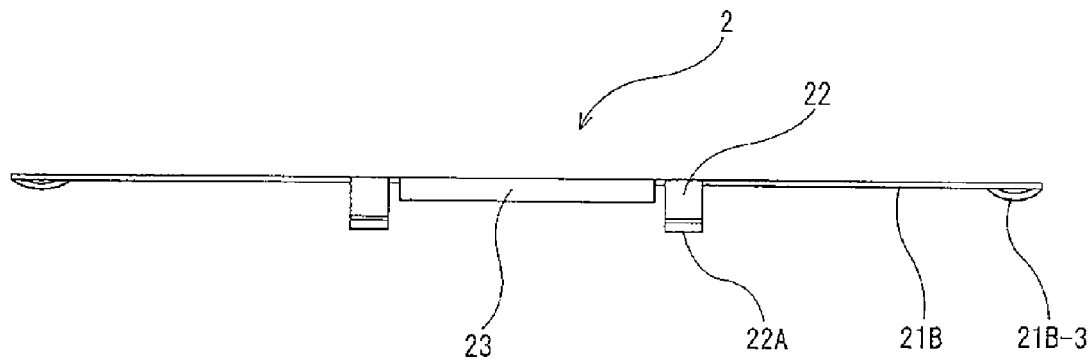
FIG. 6 is a front view showing a modified example No. 2 of the suction member according to the embodiment of the invention.

FIG. 6 is a front view showing a modified example No. 2 of the suction member 2 according to the embodiment of the invention. As shown in FIG. 6, the free end in each non-attachment region Q has a reinforcing section 21B-3. In the reinforcing section 21B-3, an edge of each free end is bent downward so as to contact with the backside. With these reinforcing sections 21B-3, the free end evenly contacts with the housing in the width direction of the suction member 2.

Figure 7:
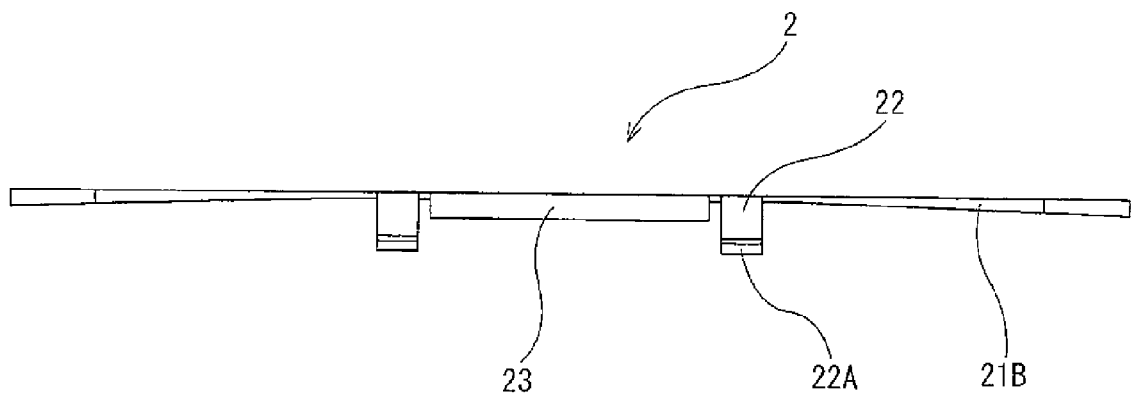
FIG. 7 a front view showing a modified example No. 3 of the suction member according to the embodiment of the invention.

FIG. 7 a front view showing a modified example No. 3 of the suction member 2 according to the embodiment of the invention. Reinforcement on the free end side in each non-attachment region Q may be enhanced by increasing the thickness of the plate portion 21 towards the free ends as shown in FIG. 7, or providing a rib at each edge in the longitudinal direction and increasing the protruding width of each rib similarly towards the free end.

Figure 8:
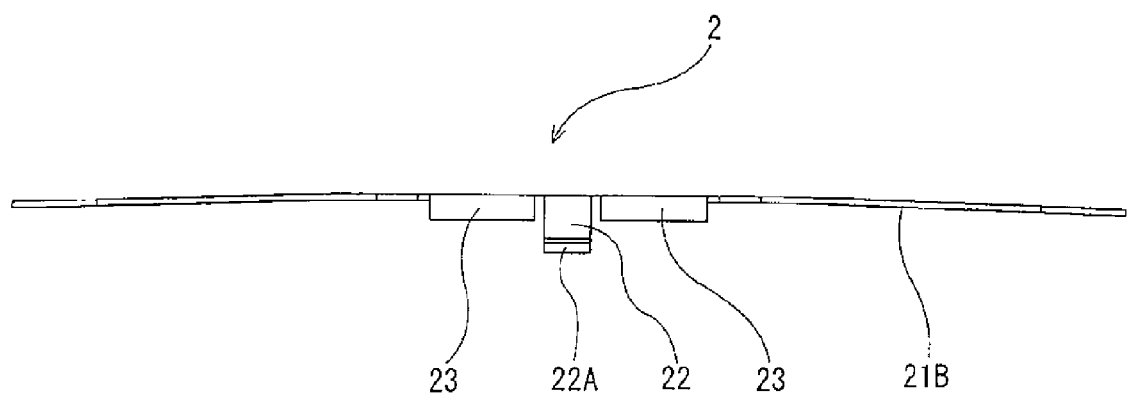
FIG. 8 a front view showing a modified example No. 4 of the suction member according to the embodiment of the invention.

FIG. 8 a front view showing a modified example No. 3 of the suction member 2 according to the embodiment of the invention. The attaching section 22 may be provided only one instead of two on each edge in the longitudinal direction in the attachment region P. For example, as shown in FIG. 8, an attaching section 22, which is an attaching leg, may be provided in the center and a reinforcing section 23 may be provided on the both sides. The reinforcing sections 23 themselves may be embodied similarly to the reinforcing sections in FIGS. 2 and 3.

In FIG. 8, however, since the reinforcing sections 23 are provided on the both ends of the attaching section 22 in the longitudinal direction, they are outside the attachment region P, i.e. within the non-attachment region Q, and reinforce the edges of the non-attachment region Q. In other words, the non-attachment region Q has a high-rigidity portion, where the reinforcing section 23 is present, and a low-rigidity portion, which is a portion other than the high-rigidity portions, and the low-rigidity portion is used as the deformable portion. This idea may be also applied even in a case where two attachment portions 22 are provided on each edge of the attachment region P.

Figure 9:
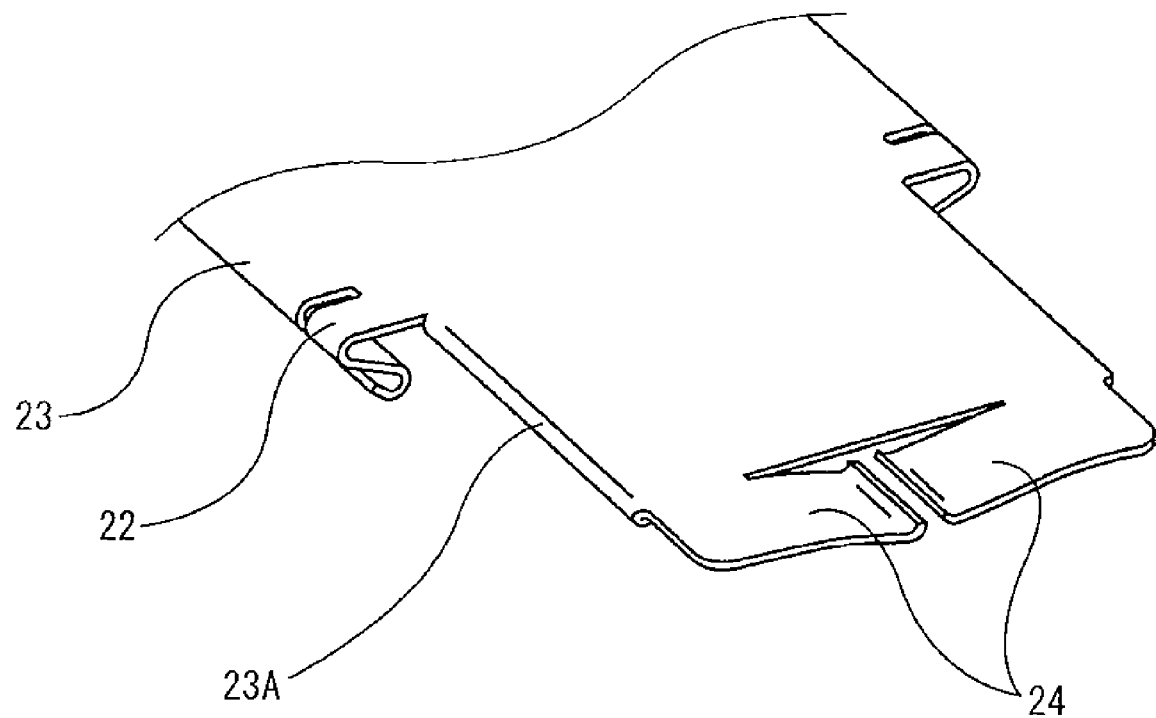
FIG. 9 a front view showing a modified example No. 5 of the suction member according to the embodiment of the invention.

FIG. 9 a front view showing a modified example No. 4 of the suction member 2 according to the embodiment of the invention. As shown in FIG. 9, it is possible to additionally provide the reinforcing sections 23A between one attachment portions 22 and the free end. In the example of FIG. 9, the free end has elastic arms 24, which are formed by cutting, extend facing to each other in the width direction of the suction member 2, and respectively have a deformed end. With the elastic arm 24, contact pressure is applied towards the housing.

Further, according to the invention, by providing the relatively wide section of the suction member as being flat and providing a protrusion on the housing, it is possible to obtain contact pressure at the deformable portion of the suction member upon attaching to the housing.

Figure 10A:
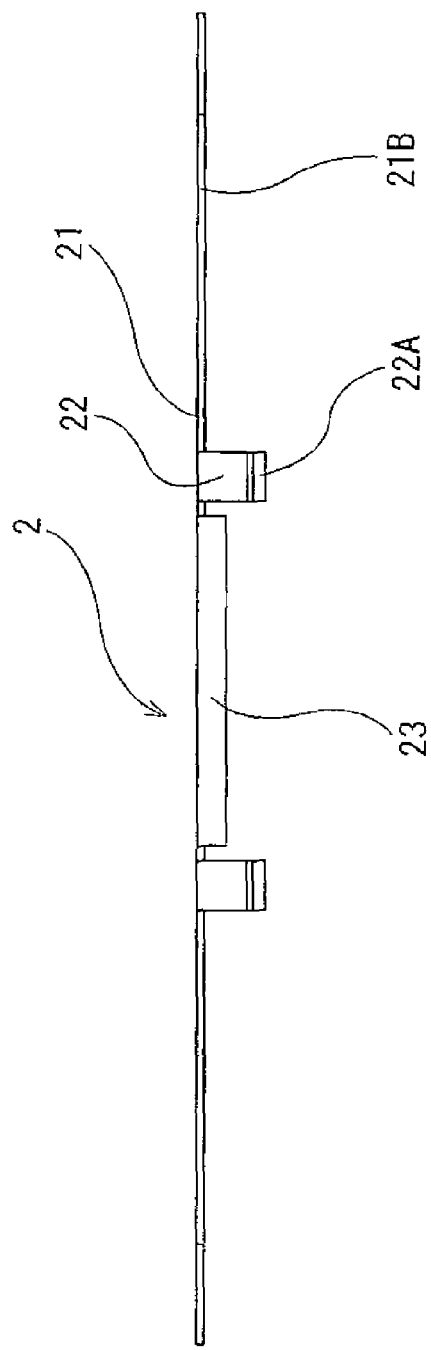
Figure 10B:
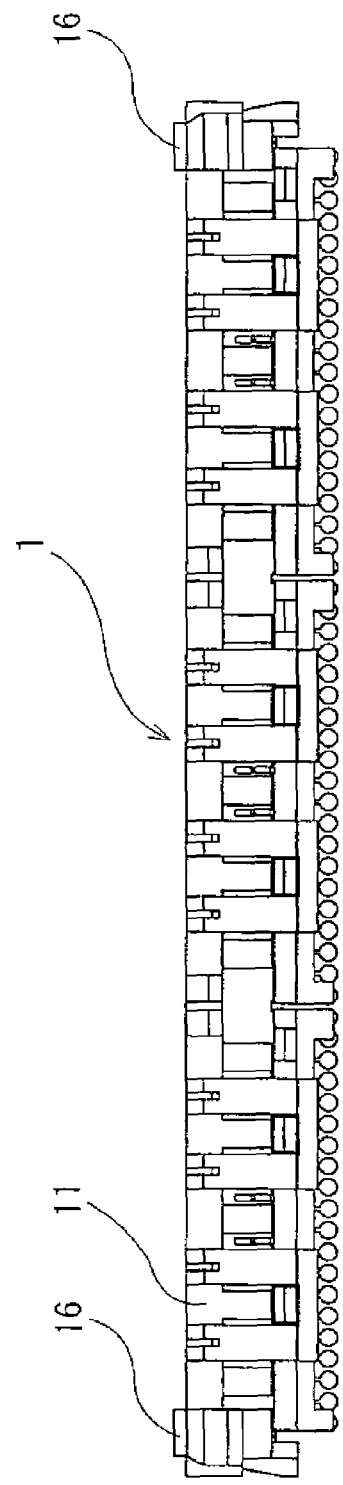

FIGS. 10(A) and 10(B) are front views showing a modified example of the electrical connector 1 according to the embodiment of the invention. More specifically, FIG. 10(A) is a front view showing the suction member 2, and FIG. 10(B) is a front view showing the electrical connector 1. As shown in FIG. 10(A), the plate portion 21 of the suction member 2 is flat over the whole length.

As shown in FIG. 10(B), the housing 11 of the connector 1 has protrusions 16 on the upper surface of the housing 11 at the both ends in the longitudinal direction. In the embodiment, if the plate portion 21 is attached to the housing 11 at the attaching section 22 while pressing the attachment region from the upper side so as to make it contact or close to the upper surface of the housing, the tips of the deformable portions 21B of the suction member 2 flex upward by the protrusions 16. With counterforce at the end portions, it is possible to obtain the aforementioned contact pressure.

The disclosure of Japanese Patent Application No. 2009-209207, filed on Sep. 10, 2009 is incorporated in the application by reference.

While the invention has been explained with reference to the specific embodiments of the invention, the explanation is illustrative and the invention is limited only by the appended claims.

What is claimed is:

1. An electrical connector, comprising:
 a housing having an opening portion in an upper surface thereof, said upper surface including a width edge in a short side direction and a side edge in a long side direction; and
 a suction member detachably attached to the housing, said suction member including a plate portion for covering the housing and an attachment portion for attaching to the housing at a middle portion of the side edge, said plate portion including an attachment region between both end portions of the attachment portion in the long side direction and a non-attachment region outside the attachment region extending to a distal end portion of the plate portion in the long side direction, said non-attachment region including a deformable portion with a free end portion to be deformable,
 wherein said attachment region is situated at a middle position of the plate portion in the long side direction, said attachment portion being disposed on an edge portion of the attachment region.

2. The electrical connector according to claim 1, wherein said plate portion is arranged to contact with the upper surface at the deformable portion.

3. The electrical connector according to claim 1, wherein said plate portion is arranged to contact with the upper surface at the deformable portion with a specific contact pressure.

4. The electrical connector according to claim 1, wherein said plate portion is arranged to contact with the upper surface at the free end portion.

5. The electrical connector according to claim 1, wherein said plate portion includes a flat surface uniformly contacting with the upper surface.

6. The electrical connector according to claim 1, wherein said plate portion is arranged so that the attachment region is away from the upper surface and the free end portion contacts with the upper surface at the deformable portion.

7. The electrical connector according to claim 1, wherein said plate portion includes a reinforcing portion disposed on the free end portion.

8. The electrical connector according to claim 1, wherein said non-attachment region includes a rigid portion adjacent to the attachment region, said rigid portion having a rigidity greater than the of the deformable portion.

9. The electrical connector according to claim 1, wherein said housing includes a protrusion disposed at both end portions thereof in the long side direction for deforming the deformable portion in a state that the suction member is attached to the housing.

10. A method of mounting the electrical connector according to claim 1 with solder, comprising the steps of:
attaching the suction member to the housing;
suctioning the suction member with a suction device;
transporting the electrical connector to a specific solder connection position;
connecting the electrical connector with solder; and
removing the suction member from the housing.

11. An electrical connector comprising,
a housing having an opening portion in an upper surface thereof, said upper surface including a width edge in a short side direction and a side edge in a long side direction; and
a suction member detachably attached to the housing, said suction member including a plate portion for covering the housing and an attachment portion for attaching to the housing at a middle portion of the side edge, said plate portion including an attachment region between both end portions of the attachment portion in the long side direction and a non-attachment region outside the attachment region extending to a distal end portion of the plate portion in the long side direction, said non-attachment region including a deformable portion with a free end portion to be deformable,
wherein said attachment portion includes en attachment leg disposed on a side edge portion of the plate portion within the attachment region, and
said plate portion includes a reinforcing portion disposed on the side edge portion of the plate portion within the attachment region and situated away from the attachment leg.

12. The electrical connector according to claim 11, wherein said attachment leg disposed on both end positions of the attachment region in the long side direction.

13. A suction member detachably attached to a housing of an electrical connector, comprising:
a plate portion for covering the housing; and
an attachment portion for attaching to the housing at a middle portion of a side edge of the housing in a long side direction,
wherein said plate portion includes an attachment region within both end portions of the attachment portion in the long side direction and a non-attachment region outside the attachment region extending to a distal end portion of the plate portion in the long side direction, said non-attachment region including a deformable portion with a free end portion to be deformable, and
said attachment region is situated at a middle position of the plate portion in the long side direction, said attachment portion being disposed on an edge portion of the attachment region.

* * * * *